(12) United States Patent
Kitamura et al.

(10) Patent No.: US 11,968,806 B2
(45) Date of Patent: Apr. 23, 2024

(54) ELECTRONIC APPARATUS AND COOLING MODULE

(71) Applicant: LENOVO (SINGAPORE) PTE. LTD., Singapore (SG)

(72) Inventors: Masahiro Kitamura, Yokohama (JP); Yusuke Onoue, Yokohama (JP); Takuroh Kamimura, Yokohama (JP); Akinori Uchino, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 194 days.

(21) Appl. No.: 17/805,043

(22) Filed: Jun. 2, 2022

(65) Prior Publication Data

US 2023/0069684 A1 Mar. 2, 2023

(30) Foreign Application Priority Data

Aug. 27, 2021 (JP) .................................. 2021-139056

(51) Int. Cl.
*H05K 7/20* (2006.01)
*G06F 1/20* (2006.01)

(52) U.S. Cl.
CPC ........... *H05K 7/2039* (2013.01); *G06F 1/203* (2013.01); *H05K 7/20136* (2013.01); *H05K 7/20336* (2013.01)

(58) Field of Classification Search
CPC combination set(s) only.
See application file for complete search history.

(56) References Cited

U.S. PATENT DOCUMENTS

| 11,662,154 | B2 * | 5/2023 | Toth | G06F 1/203 |
| | | | | 165/104.26 |
| 2007/0002537 | A1 * | 1/2007 | Tomioka | G06F 1/203 |
| | | | | 361/695 |
| 2007/0002538 | A1 * | 1/2007 | Tomioka | G06F 1/203 |
| | | | | 361/695 |
| 2011/0110041 | A1 * | 5/2011 | Wong | H05K 7/20445 |
| | | | | 361/690 |
| 2022/0011054 | A1 * | 1/2022 | Hanano | H01L 23/427 |
| 2022/0015260 | A1 * | 1/2022 | Uchino | H05K 7/2039 |
| 2022/0205731 | A1 * | 6/2022 | Toth | H01L 23/3677 |

(Continued)

FOREIGN PATENT DOCUMENTS

| JP | 2018186272 A | 11/2018 |
| JP | 2019032134 A | 2/2019 |
| JP | 2019056511 A | 4/2019 |

(Continued)

*Primary Examiner* — Lisa Lea-Edmonds
(74) *Attorney, Agent, or Firm* — SHIMOKAJI IP (57) ABSTRACT

An electronic apparatus includes: a chassis; first and second heating elements in the chassis; and a cooling module absorbing the heat. The cooling module includes: a first vapor chamber connected to the first heating element; and a second vapor chamber connected to the second heating element. The first and second vapor chambers are placed adjacent to each other with a step therebetween. The first vapor chamber has a bridge that is a part of at least one of the two first metal plates, the bridge straddling the step and extending toward the second vapor chamber to be connected to a surface of the second vapor chamber. The bridge is not provided with the closed space.

8 Claims, 7 Drawing Sheets

(56) References Cited

U.S. PATENT DOCUMENTS

| 2023/0022994 A1* | 1/2023 | Sun ................... H05K 7/20336 |
| 2023/0069684 A1* | 3/2023 | Kitamura ................ G06F 1/203 |

FOREIGN PATENT DOCUMENTS

| JP | 2019165167 A | 9/2019 |
| JP | 2020042588 A | 3/2020 |
| JP | 2021012590 A | 2/2021 |

\* cited by examiner

ELECTRONIC APPARATUS AND COOLING MODULE

TECHNICAL FIELD

The present disclosure relates to an electronic apparatus including a cooling module, and a cooling module.

BACKGROUND

Electronic apparatuses such as laptop PCs are equipped with a heating element such as a CPU. These electronic apparatuses have a cooling module inside the chassis to absorb the heat generated by the heating element and dissipate it to the outside.

SUMMARY

An electronic apparatus according to one aspect of the present disclosure includes: a chassis; first and second heating elements in the chassis; and a cooling module in the chassis, the cooling module absorbing heat generated from the first and second heating elements. The cooling module includes: a first vapor chamber connected to the first heating element and including two first metal plates defining a closed space therebetween to contain a working fluid in the closed space; and a second vapor chamber connected to the second heating element and including two second metal plates defining a closed space therebetween to contain a working fluid in the closed space. The first and second vapor chambers are placed side by side adjacent to each other with a step therebetween. The first vapor chamber has a bridge that is a part of at least one of the two first metal plates, the bridge straddling the step and extending toward the second vapor chamber to be connected to a surface of the second vapor chamber. The bridge is not provided with the closed space.

A cooling module according to another aspect of the present disclosure is configured to absorb heat from a plurality of heating elements disposed in a chassis of an electronic apparatus. The cooling module includes: a first vapor chamber including two first metal plates defining a closed space therebetween to contain a working fluid in the closed space; and a second vapor chamber including two second metal plates defining a closed space therebetween to contain a working fluid in the closed space. The first and second vapor chambers are placed side by side adjacent to each other with a step therebetween. The first vapor chamber has a bridge that is a part of at least one of the two first metal plates, the bridge straddling the step and extending toward the second vapor chamber to be connected to a surface of the second vapor chamber. The bridge is not provided with the closed space.

DETAILED DESCRIPTION

Referring to the drawings, the following describes an electronic apparatus and a cooling module according to the present disclosure in details by way of a preferable embodiment.

Figure 1:
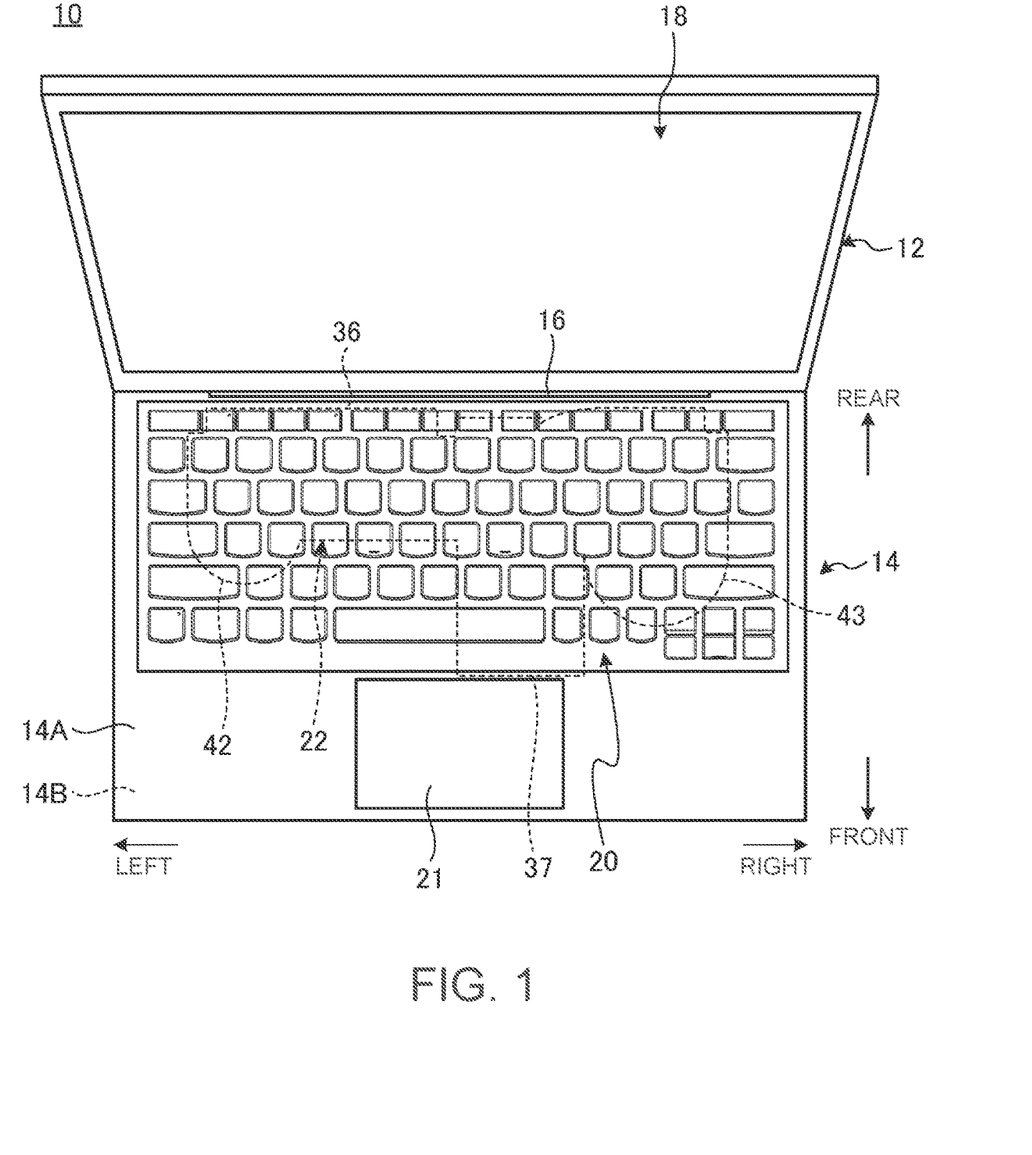
FIG. 1 is a schematic top plan view of an electronic apparatus.

FIG. 1 is a schematic top plan view of an electronic apparatus 10 according to one embodiment. As illustrated in FIG. 1, the electronic apparatus 10 is a clamshell-shaped laptop PC including a display chassis 12 and a chassis 14 that are relatively rotatably connected with hinges 16, and may be called a mobile workstation. The electronic apparatus of the present disclosure may be of various types other than the laptop PC, including a desktop PC, a tablet PC, a mobile phone, a smartphone, and a game machine.

The display chassis 12 is a thin, flat box. The display chassis 12 is to mount a display 18. In one example, the display 18 includes an organic light emitting diode (OLED) or liquid crystal.

The following describes the chassis 14 and the elements mounted on this, assuming that, with reference to the posture of the electronic apparatus, in which the chassis 12 and 14 are opened as illustrated in FIG. 1 to view the display 18, a part closer to the user is front, a part away from the user is rear, the width direction is left and right, and the height direction (thickness direction of the chassis 14) is top and bottom.

The chassis 14 is a thin, flat box. The chassis 14 has a cover member 14A that defines the top face and the four surrounding side faces and a cover member 14B that defines the bottom face. The upper cover member 14A has a substantially bathtub shape with the bottom face open. The lower cover member 14B has a substantially flat plate shape, and serves as a lid that closes the bottom-face opening of the cover member 14A. These cover members 14A and 14B are overlapped in the thickness direction and are detachably connected to each other. The top face of the chassis 14 includes a keyboard unit 20 and a touchpad 21. The chassis 14 is connected to the display chassis 12 at the rear end via the hinges 16.

Figure 2:
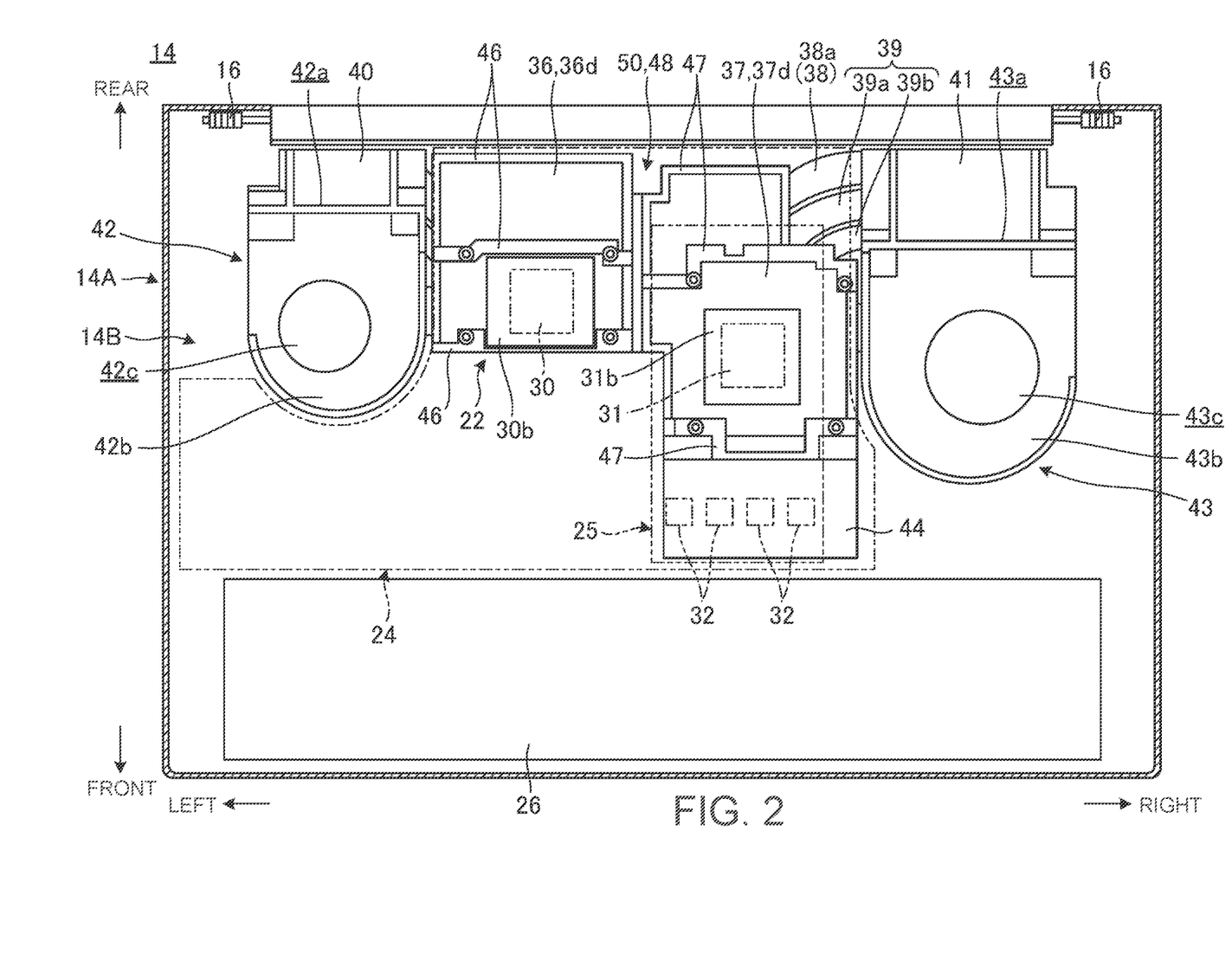
FIG. 2 is a plan view schematically illustrating the internal configuration of the chassis.

FIG. 2 is a schematic plan view illustrating the internal configuration of the chassis 14 in cross section, which is cut along a plane of the chassis 14 slightly below the keyboard 20.

As illustrated in FIG. 2, the chassis 14 accommodates a cooling module 22, a motherboard 24, a sub-board 25, and a battery unit 26. The chassis 14 also accommodates various electronic components and mechanical components.

The motherboard 24 is the main board of the electronic apparatus 10. The motherboard 24 is located near the rear of the chassis 14 and extends left to right. The motherboard 24 is a printed circuit board, on which various electronic components such as a communication module, a memory, and a connecting terminal are mounted in addition to a central processing unit (CPU) 30. The motherboard 24 is located under the keyboard 20 and is screwed to the rear face of the keyboard 20 and the inner face of the cover member 14A. The motherboard 24 has the top face that is to be attached to the cover member 14A, and the bottom face that is a mounting face 24a, on which the CPU 30 and the like are mounted (see FIG. 5). The CPU 30 is located in substantially the center of the left and right sides of the mounting face 24a of the motherboard 24. The CPU 30 performs calculations related to the main control and processing of the electronic apparatus 10. Reference numeral 30a in FIG. 5 denotes a package board, on which the CPU (die) 30 is mounted.

The sub-board 25 is an expansion card with a smaller outline than that of the motherboard 24. The sub-board 25 is a printed circuit board, on which various electronic components such as a graphics processing unit (GPU) 31 and a power component 32 are mounted. The sub-board 25 is stacked above the motherboard 24 near the right end of the mounting face 24a (see FIGS. 2 and 5). On substantially the center of the sub-board 25, the GPU 31 is mounted. The sub-board 25 is connected to a connector 33 mounted on the motherboard 24 (see FIG. 5), thereby electrically connecting to the motherboard 24. The sub-board 25 has the top face that is to be attached to the mounting face 24a of the motherboard 24, and the bottom face that is a mounting face 25a, on which the GPU 31 and the like are mounted. The GPU 31 performs calculations necessary to depict images such as 3D graphics. Reference numeral 31a in FIG. 5 denotes a package board, on which the GPU (die) 31 is mounted.

The battery unit 26 is a rechargeable battery that serves as a power source for the electronic apparatus 10. The battery unit 26 is located in front of the motherboard 24 and extends left to right along the front edge of the chassis 14.

Next, the configuration of the cooling module 22 is described.

The CPU 30 and the GPU 31 are heating elements with the largest amount of heat generated among the electronic components mounted in the chassis 14. The cooling module 22 then absorbs and diffuses the heat generated from the CPU 30 and the GPU 31 and discharges it to the outside of the chassis 14. The cooling module 22 is stacked below the bottom faces of the motherboard 24 and the sub-board 25 (under their mounting faces 24a and 25a).

Figure 3:
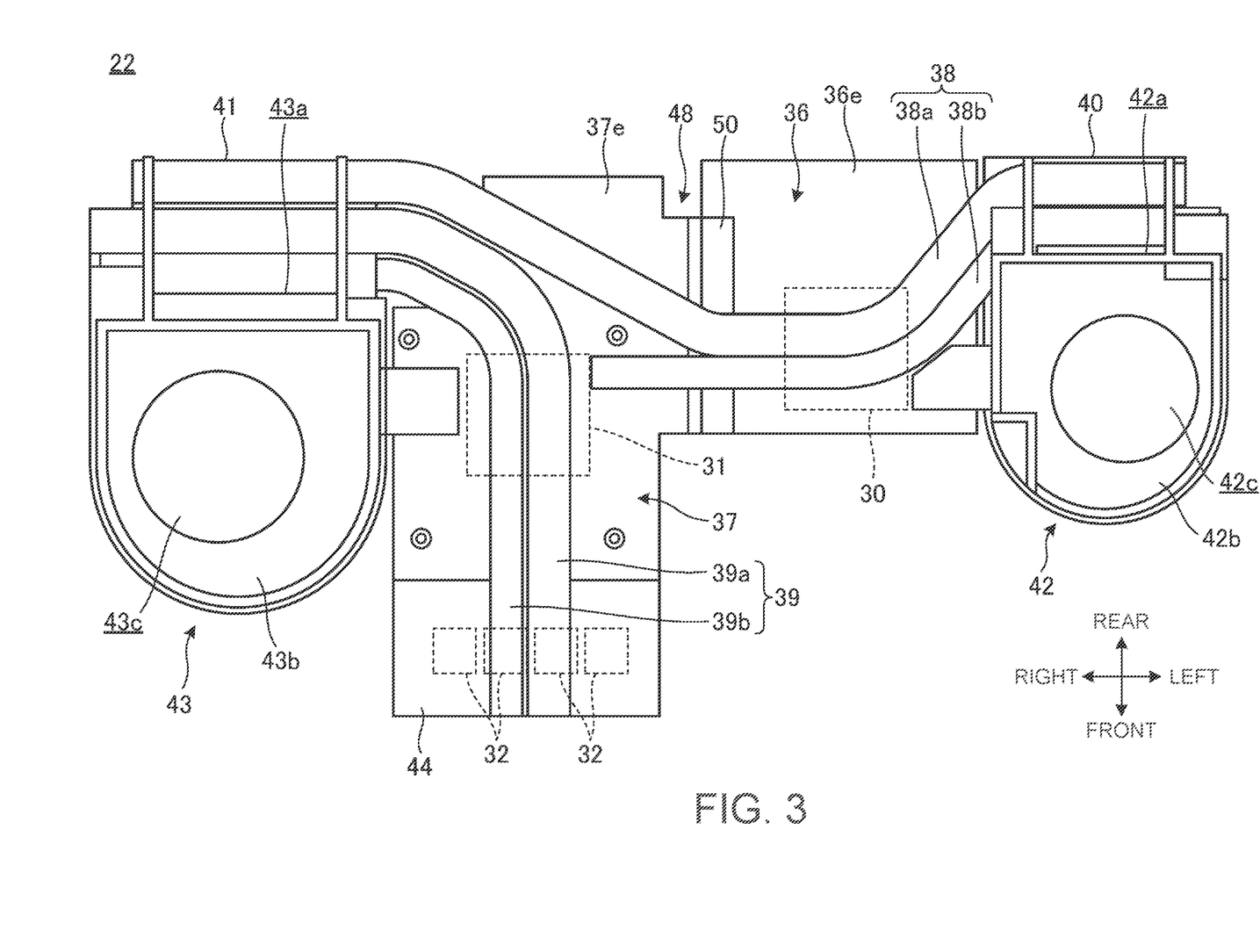
FIG. 3 is a schematic bottom view of the cooling module.
Figure 4:
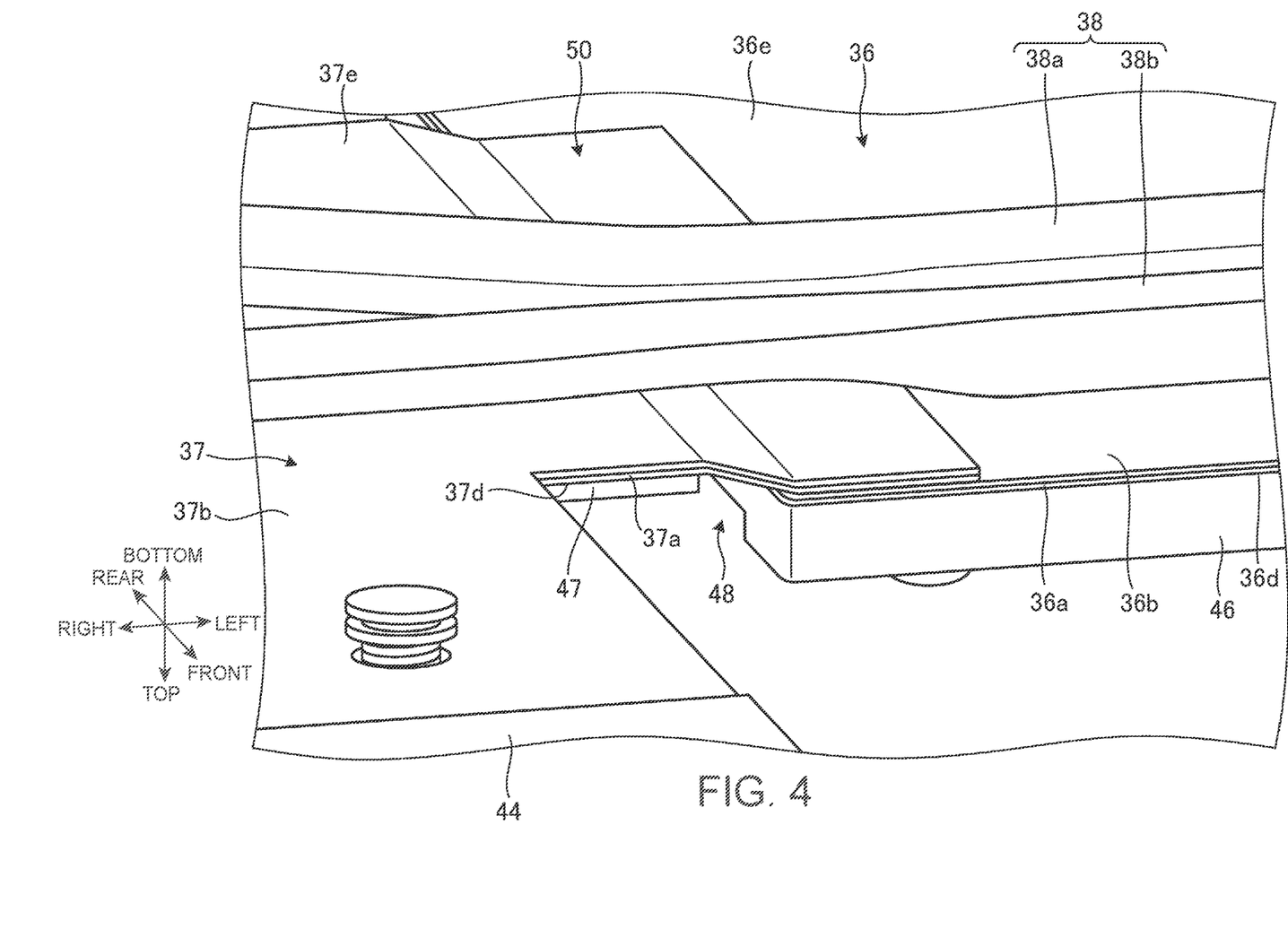
FIG. 4 is an enlarged perspective view of a bridge of the cooling module and its surroundings.
Figure 5:
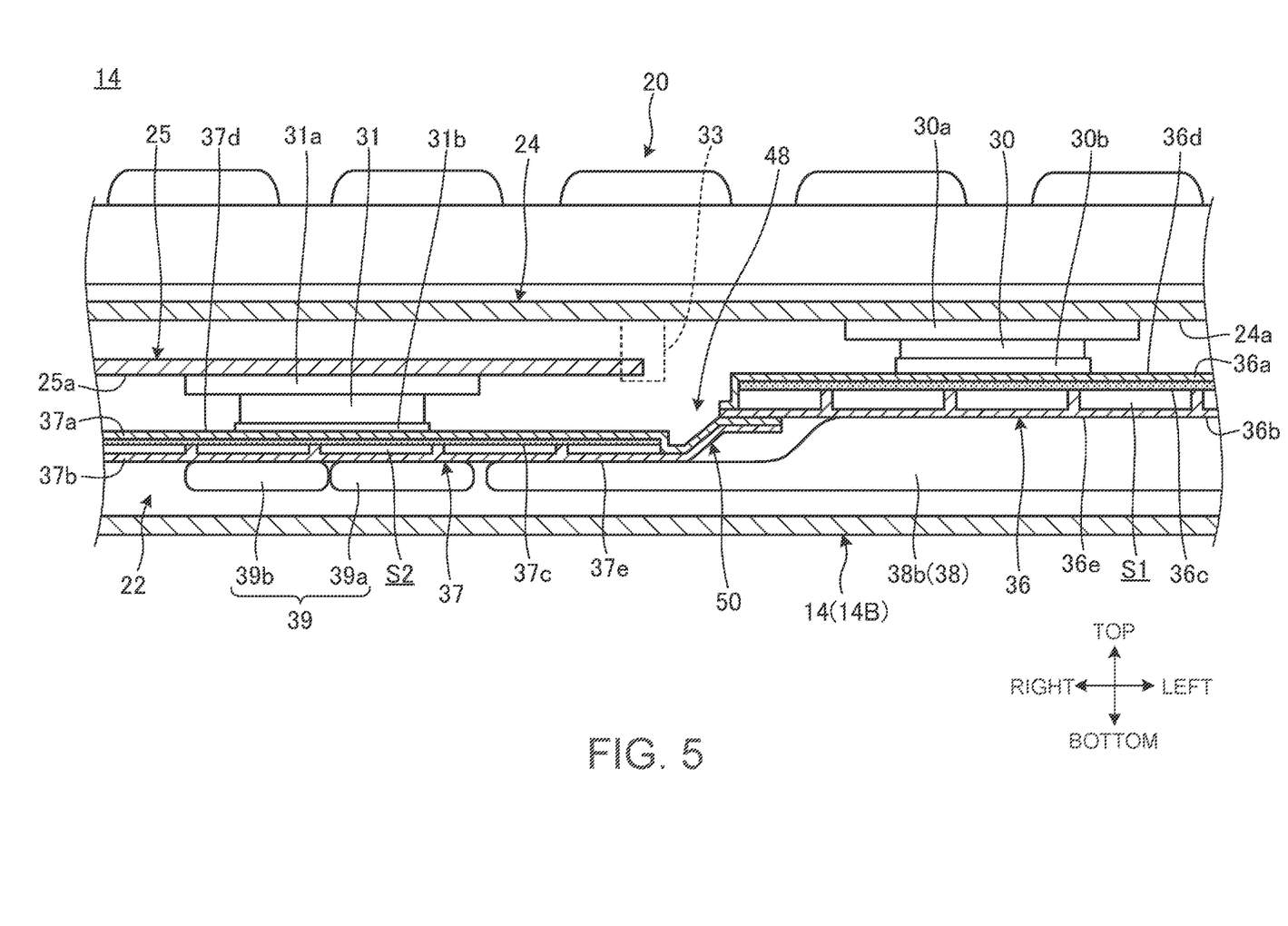
FIG. 5 is an enlarged cross-sectional view of the major portion illustrating the internal configuration of the chassis.
Figure 6:
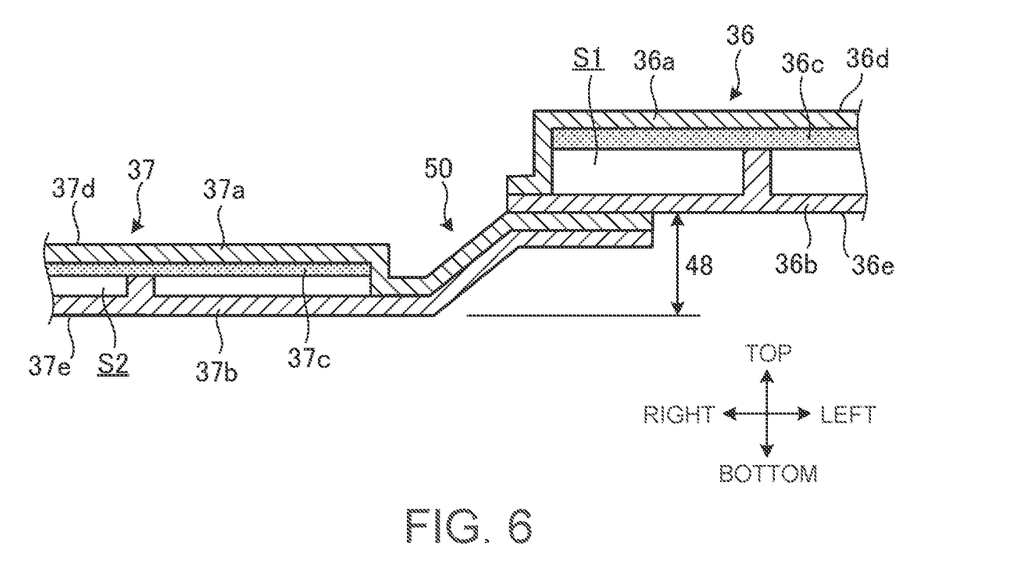
FIG. 6 is an enlarged cross-sectional view of the bridge illustrated in FIG. 5 and its surroundings.

FIG. 3 is a schematic bottom view of the cooling module 22. FIG. 4 is an enlarged perspective view of a bridge 50 of the cooling module 22 and its surroundings. FIG. 5 is an enlarged cross-sectional view of the major portion illustrating the internal configuration of the chassis 14. FIG. 6 is an enlarged view of the bridge 50 illustrated in FIG. 5 and its surroundings.

As illustrated in FIGS. 2 to 5, the cooling module 22 includes first and second vapor chambers 36 and 37 placed side by side in the left-right direction, a first heat pipe 38 including a set of two pipes, a second heat pipe 39 including a set of two pipes, a pair of left and right cooling fins 40 and 41, a pair of left and right blower fans 42 and 43, and a heat conduction plate 44.

The vapor chambers 36 and 37 are plate-shaped heat transport devices. The first vapor chamber 36 includes two thin metal plates 36a and 36b defining a closed space S1 therebetween (see FIG. 5), and working fluid contained in this closed space S1. The metal plates 36a and 36b are made of metal with high thermal conductivity, such as aluminum, copper, or stainless steel. The closed space S1 is a flow channel, through which the contained working fluid flows while undergoing a phase change. Examples of the working fluid include water, CFC (chlorofluorocarbon) substitutes, acetone, and butane. In the closed space S1, a wick 36c is provided, which sends the condensed working fluid by capillarity (see FIG. 5). In one example, the wick 36c includes a mesh made by knitting fine metal wires into a cotton-like pattern and a porous body such as a fine flow channel.

The second vapor chamber 37 has the same basic configuration as the first vapor chamber 36 described above, except that the outer shape is larger and the plate thickness is slightly thinner than those of the first vapor chamber 36. That is, the second vapor chamber 37 includes two thin metal plates 37a and 37b defining a closed space S2 therebetween (see FIG. 5), a wick 37c provided in this closed space S2, and working fluid contained in this closed space S2. For the second vapor chamber 37, the material of the metal plates 37a and 37b, the type of working fluid, and the configuration of the wick 37c may be the same as in the first vapor chamber 36 described above.

The vapor chambers 36, 37 are thin and easily deformed. The vapor chambers 36 and 37 therefore are reinforced by bonding frames 46 and 47 to the outer peripheral edges and the central portions of the top faces (first faces 36d and 37d) (see FIGS. 2 and 4). The frames 46, 47 are made of metal such as stainless steel and have a shape like a frame with a bar thicker than the vapor chambers 36, 37.

As illustrated in FIGS. 4 through 6, the vapor chambers 36, 37 are placed side by side adjacent to each other with a vertical step (i.e., level difference) 48 (see FIG. 6) between them. This step 48 is due to the configuration of stacking the sub-board 25, on which the GPU 31 is mounted, under the bottom face of the motherboard 24, on which the CPU 30 is mounted, where the GPU 31 is thicker than the CPU 30. That is, the top face of the GPU 31 is located lower than the top face of the CPU 30 (see FIG. 5), so that the cooling module 22 includes the second vapor chamber 37 that cools the GPU 31 located lower than the first vapor chamber 36 that cools the CPU 30. The step height between the top face of the CPU 30 and the top face of the GPU 31 is, for example, 4 to 5 mm.

The second vapor chamber 37 includes a bridge 50 that extends diagonally upward so as to straddle the step 48 and is bonded (for example, soldered) to the second face 36e of the first vapor chamber 36. The tip of the bridge 50 is bonded at a position overlapping with the closed space S1 of the first vapor chamber 36. The bridge 50 is a heat transfer member that thermally connects the vapor chambers 36 and 37 for mutual complement of cooling capacity.

The bridge 50 is a fin-like plate piece that is a part of the outer edges of the metal plates 37a, 37b of the second vapor chamber 37 adjacent to the first vapor chamber 36 that extends toward the first vapor chamber 36. The bridge 50 includes the bonded portion of the metal plates 37a and 37b that are located at the outer edge of the second vapor chamber 37. This means that the bridge 50 is not provided with the closed space S2 containing the working fluid. In other words, heat transport by phase change of the working fluid inside the second vapor chamber 37 does not occur in the bridge 50, but heat transport by heat conduction by the metal plates 37a, 37b occurs.

As illustrated in FIGS. 3 through 5, the first heat pipe 38 is a pipe-shaped heat transport device. In this embodiment, two heat pipes 38a, 38b are used in parallel as a pair in front and back, and one or three or more heat pipes may be used. The heat pipes 38a and 38b are each made by flattening a metal pipe into an elliptical cross-sectional shape, and working fluid is contained in a closed space defined with the metal pipe. The metal pipes are made of metal with high thermal conductivity, such as aluminum, copper, or stainless steel. The closed space is a flow channel, through which the contained working fluid flows while undergoing a phase change. Examples of the working fluid include water, CFC (chlorofluorocarbon) substitutes, acetone, and butane. In the closed space, a wick is provided, which sends the condensed working fluid by capillarity. In one example, the wick includes a mesh made by knitting fine metal wires into a cotton-like pattern and a porous body such as a fine flow channel.

The second heat pipe 39 has the same basic configuration as the first heat pipe 38 described above, except that the length and the path are different. That is, the second heat pipe 39 is provided with a wick in the closed space inside a flattened metal pipe and filled with a working fluid. For the second heat pipe 39 of this embodiment, two heat pipes 39a, 39b are used in parallel as a pair in front and back or left and right, and one or three or more heat pipes may be used. For the second heat pipe 39, the material of the metal pipes, the type of working fluid, and the configuration of the wick may be the same as in the first heat pipe 38 described above.

As illustrated in FIGS. 2 and 3, the left cooling fin 40 includes a plurality of plate-like fins placed at equal intervals in the left and right directions on the surface of the plate. Each fin stands up in the top-bottom direction and extends in the front-back direction. The adjacent fins define a gap therebetween, through which air sent from the blower fan 42 passes. The cooling fin 40 is made of metal with high thermal conductivity, such as aluminum or copper.

The right cooling fin 41 is slightly different in size and the like, but has the basic configuration that is symmetrical with the left cooling fin 40. The detailed description thereof will be omitted.

As illustrated in FIGS. 2 and 3, the blower fan 42 on the left is located just in front of the cooling fin 40. In other words, the cooling fin 40 is placed facing a rearward-opening exhaust port 42a of the blower fan 42. The blower fan 42 is a centrifugal fan that rotates an impeller housed inside a fan housing 42b by a motor. The blower fan 42 draws air in through intake ports 42c opening at the top and bottom faces of the fan housing 42b and discharges the air inside the chassis 14 through the exhaust port 42a. Air blown from the exhaust port 42a passes through the cooling fins 40 and promotes heat dissipation.

The blower fan 43 on the right is slightly different in size and the like, but has the basic configuration that is symmetrical with the blower fan 42 on the left. The detailed description thereof will be omitted. That is, the blower fan 43 also has a rearward-opening exhaust port 43a and intake ports 43c opening at the top and bottom faces of the fan housing 43b. The cooling fin 41 is placed facing the exhaust port 43a of the blower fan 43.

As illustrated in FIGS. 2 and 3, the heat conduction plate 44 is connected to the front edge of the second vapor chamber 37 and protrudes forward. The heat conduction plate 44 is a thin plate made of a material with high thermal conductivity, including graphite or metal such as aluminum or copper. The heat conduction plate 44 is placed to cover a power component 32, and the heat pipe 39 is bonded to the bottom face thereof. With this configuration, the heat conduction plate 44 absorbs heat from the power component 32 and transfers it to the heat pipe 39. The heat conduction plate 44 can be thinner than the second vapor chamber 37, and it can be easily installed on the tall power component 32.

In the cooling module 22 configured as described above, the first face 36d of the first vapor chamber 36 abuts on the CPU 30 via a heat receiving plate 30b. The first face 37d of the second vapor chamber 37 abuts on the GPU 31 via a heat receiving plate 31b. The heat receiving plates 30b and 31b are made of metal with high thermal conductivity, such as copper or aluminum.

The central portion of the first heat pipe 38 is curved to the front and extends in the left-right direction as a whole. The substantially center portion of the first heat pipe 38 as the heat receiving part is bonded to the second face 36e of the first vapor chamber 36 at a position overlapping with the CPU 30. One heat pipe 38a has its left end (heat dissipating part) bonded to the bottom face of the cooling fin 40 and its right end (heat receiving part) bonded to the second face 37e of the second vapor chamber 37 over the bridge 50. The other heat pipe 38b has its left end (heat dissipating part) bonded to the bottom face of the cooling fin 40 and its right end (heat receiving part) extending over the bridge 50 and along the second face 37e of the second vapor chamber 37 to be bonded to the bottom face of the cooling fin 41. The majority of the first heat pipe 38 is bonded to the second faces 36e, 37e of the vapor chambers 36, 37.

The second heat pipe 39 is arranged in a substantially L shape as a whole. The substantially center portion of the second heat pipe 39 as the heat receiving part is bonded to the second face 37e of the second vapor chamber 37 at a position overlapping with the GPU 31. The second heat pipe 39 has its right end (heat dissipating part) bonded to the bottom face of the cooling fin 41 and its front end (heat receiving part) extending along the second vapor chamber 37 to be bonded to the bottom face of the heat conduction plate 44. The two heat pipes 39a and 39b follow substantially the same path in parallel. The majority of the second heat pipe 39 is bonded to the second face 37e of the second vapor chamber 37.

With this configuration, the heat generated from the CPU 30 and GPU 31 is absorbed and diffused in the vapor chambers 36 and 37, and is efficiently transported to the cooling fins 40 and 41 via the heat pipes 38 and 39. Then the heat is discharged to the outside of the chassis 14 by the airflow of the blower fans 42 and 43.

Note here that the CPU 30 and GPU 31 do not both operate at maximum output at the same time, and are usually in an operating state where the load on one is high and the load on the other is low. Considering this, the cooling module 22 of the present embodiment is configured so that the bridge 50 connects the first vapor chamber 36 for the CPU 30 and the second vapor chamber 37 for the GPU 31.

Thus, when the load of the CPU 30 is small, for example, the first vapor chamber 36 of the cooling module 22 assists the second vapor chamber 37, which absorbs the heat of the GPU 31 with a large load, and vice versa. As a result, the cooling module 22 greatly improves the cooling efficiency as a whole, and makes the temperature of the entire module uniform. This avoids localized high-temperature areas (hot spots) on the outer surface of the chassis 14.

Figure 7:
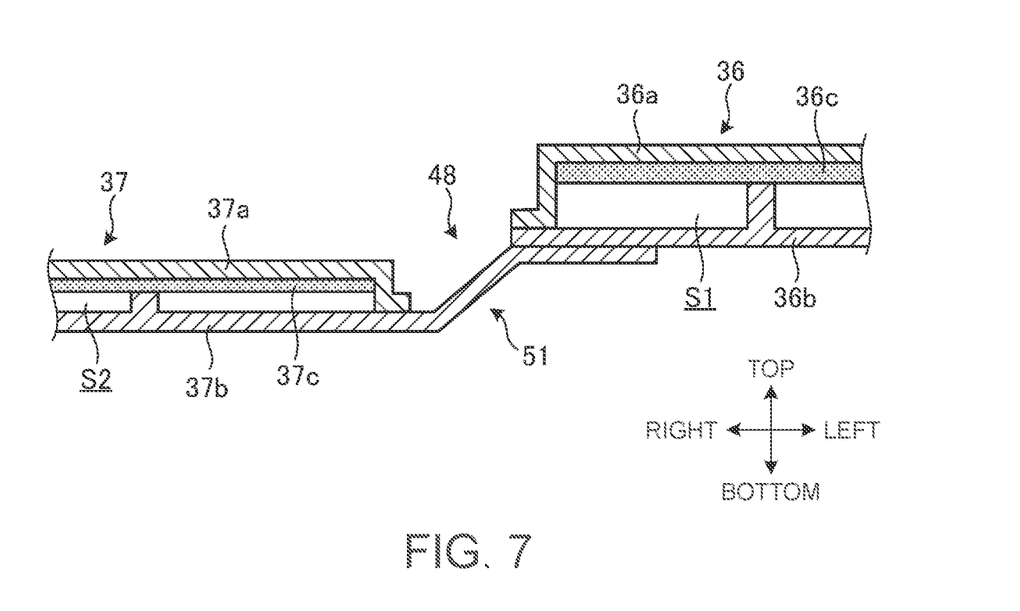
FIG. 7 is an enlarged cross-sectional view of the bridge and its surroundings.

As illustrated in FIG. 7, the cooling module 22 may include a bridge 51 instead of the bridge 50. The bridge 51 is configured so that only one metal plate 37b is extended. The bridge 51 may include a metal plate 37a.

Figure 8:
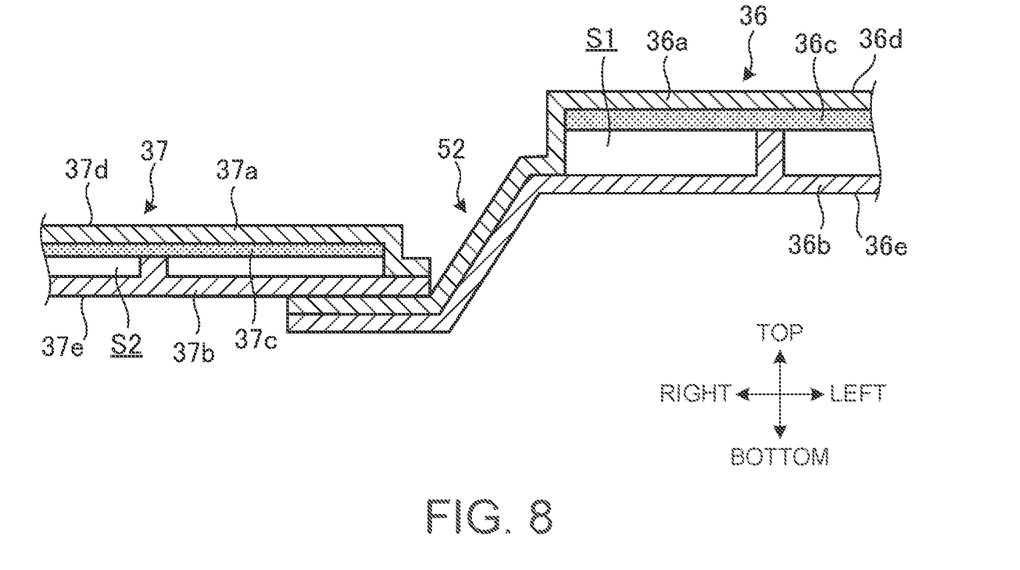
FIG. 8 is an enlarged cross-sectional view of the bridge and its surroundings.
Figure 9:
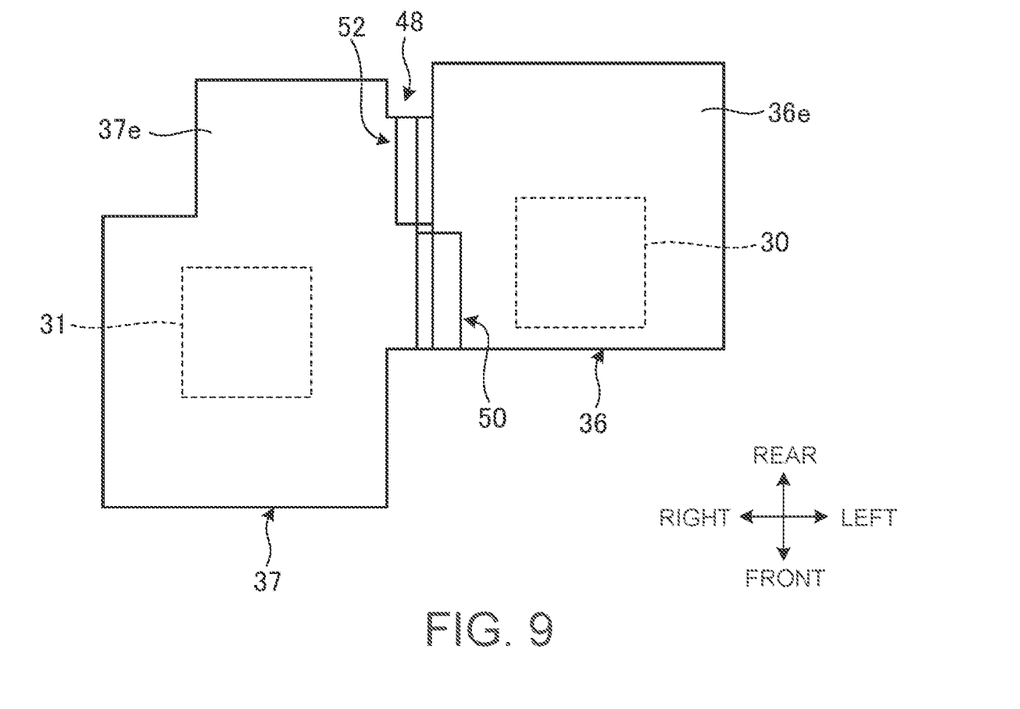
FIG. 9 is an enlarged plan view of the bridge and its surroundings.

As illustrated in FIG. 8, the cooling module 22 may include a bridge 52 instead of the bridge 50 or 51. The bridge 52 is formed at the first vapor chamber 36, and is bonded to the second face 37e of the second vapor chamber 37 across the step 48. The tip of the bridge 52 is bonded at a position overlapping with the closed space S2 of the second vapor chamber 37. Similar to the bridge 50 or 51, the bridge 52 may be configured with both or one of the metal plates 36a and 36b of the first vapor chamber 36 that protrudes. As illustrated in FIG. 9, the bridges 50 (51) and 52 may be used together.

As described above, the electronic apparatus 10 according to the present embodiment includes the cooling module 22 that absorbs heat generated from the first and second heating elements (CPU30, GPU31) placed in the chassis 14. The cooling module 22 includes the first vapor chamber 36 connected to the CPU 30 and the second vapor chamber 37 connected to the GPU 31. These vapor chambers 36, 37 are placed side by side adjacent to each other with the step 48 between them. At least one vapor chamber has the bridge 50 (51, 52) bonded to the surface of the other vapor chamber. The bridge 50 (51, 52) includes one or two metal plates 36a, etc., and has no closed space S1, S2.

In this way, the electronic apparatus 10 has a step between the CPU 30 and the GPU 31, and thus has the step 48 between the vapor chambers 36 and 37. These vapor chambers 36 and 37 are thermally connected to each other by the bridge 50 or the like, and one of the vapor chambers 36 and 37 complements the other depending on the difference in load between the CPU 30 and the GPU 31. The cooling module 22 therefore has high cooling efficiency, and makes the temperature distribution of the chassis 14 uniform. The bridge 50 is made by bending the outer edges of the metal plates 37a and 37b, so it smoothly extends over the step 48 between the vapor chambers 36 and 37 and has minimum thermal resistance. That is, the cooling module 22 seamlessly thermally connects the first vapor chamber 36 for the CPU 30 and the second vapor chamber 37 for the GPU 31 with the bridge 50, and enables mutual complement of the vapor chambers 36 and 37 depending on the remaining capacity of these vaper chambers.

In the case of the configuration of cooling the CPU 30 and GPU 31 together with a single vapor chamber, the closed space of the vapor chamber would be bent at the part over the step 48. In this case, the behavior of the working fluid in the closed space at this bend becomes unstable and thermal resistance significantly increases there, resulting in a decrease in the heat transport efficiency of the entire vapor chamber. The vapor chamber bent with high accuracy has another problem in terms of manufacturability.

In this regard, the cooling module 22 of the present disclosure includes the two vapor chambers 36, 37 and connects them with the bridge 50 and the like made of metal plates that do not have a closed space. The cooling module 22 therefore enables smooth heat transfer between the two vapor chambers 36 and 37 while maximizing the heat transfer efficiency of the vapor chambers 36 and 37, and achieves the above-mentioned complementary effect.

In the cooling module 22, the bridge 50 and the like are bonded at a position overlapping with the closed space S1, S2 of the other vapor chamber (see FIGS. 6 to 8). This configuration allows the bridge 50 and the like to directly exchange heat with the working fluid, which further improves the heat transfer efficiency between the vapor chambers 36 and 37.

The present disclosure is not limited to the above-described embodiments, and can be modified freely without deviating from the scope of the present disclosure.

These embodiments may include only one of the blower fans 42 and 43 and of the cooling fins 40 and 41, not a pair of left and right. The heat receiving plates 30a and 31a and the heat conduction plate 44 may be omitted.

The invention claimed is:

1. An electronic apparatus comprising:
   a chassis;
   first and second heating elements in the chassis; and
   a cooling module in the chassis, the cooling module absorbing heat generated from the first and second heating elements,
   the cooling module comprising:
      a first vapor chamber connected to the first heating element and including two first metal plates defining a first closed space therebetween to contain a first working fluid in the first closed space; and
      a second vapor chamber connected to the second heating element and including two second metal plates defining a second closed space therebetween to contain a second working fluid in the second closed space;
   the first and second vapor chambers being side-by-side to each other with a step therebetween,
   the first vapor chamber having a bridge that is a part of at least one of the two first metal plates, the bridge straddling the step and extending toward to a surface of the second vapor chamber,
   the bridge being outside of the first and second closed spaces.

2. The electronic apparatus according to claim 1, wherein:
   the bridge overlaps the second closed space of the second vapor chamber.

3. The electronic apparatus according to claim 1, wherein the first heating element is connected to a first face of the first vapor chamber,
   the second heating element is connected to a first face of the second vapor chamber,
   the bridge is bonded to a second face of the second vapor chamber, and
   the cooling module further comprises:
      a first heat pipe including a first metal pipe that is bonded to a second face of the first vapor chamber and passing through a position overlapping the first heating element in a thickness direction of the first vapor chamber, the first heat pipe containing a first working fluid in a first closed space inside the first metal pipe;
      a second heat pipe including a second metal pipe that is bonded to the second face of the second vapor chamber and passing through a position overlapping the second heating element in a thickness direction of the second vapor chamber, the second heat pipe containing a second working fluid in a second closed space inside the metal pipe;
      a first blower fan;
      a second blower fan;
      a first cooling fin bonded to an end of the first heat pipe and facing a first exhaust port of the first blower fan; and
      a second cooling fin bonded to an end of the second heat pipe and facing a second exhaust port of the second blower fan.

4. The electronic apparatus according to claim 1, wherein the first heating element includes a CPU, and the second heating element includes a GPU.

5. The electronic apparatus according to claim 4, further comprising:
   a motherboard in the chassis and having a mounting face on which the CPU is mounted; and
   a sub-board in the chassis, and on which the GPU is mounted,
   wherein
   the sub-board is stacked above the mounting face of the motherboard on which the CPU is mounted.

6. A cooling module configured to absorb heat from a plurality of heating elements in a chassis of an electronic apparatus, comprising:
- a first vapor chamber including two first metal plates defining a first closed space therebetween to contain a first working fluid in the first closed space; and
- a second vapor chamber including two second metal plates defining a second closed space therebetween to contain a second working fluid in the second closed space,
- the first and second vapor chambers being side-by-side to each other with a step therebetween,
- the first vapor chamber having a bridge that is a part of at least one of the two first metal plates, the bridge straddling the step and extending to a surface of the second vapor chamber,
- the bridge being outside of the first and second closed spaces.

7. The cooling module according to claim 6, wherein: the bridge overlaps with the second closed space of the second vapor chamber.

8. The cooling module according to claim 6, wherein:
- the first vapor chamber has a first face that is a first heat-absorbing face for the heating elements,
- the second vapor chamber has a first face that is a second heat-absorbing face for the heating elements,
- the bridge is bonded to a second face of the second vapor chamber, and
- the cooling module further comprises:
    - a first heat pipe including a first metal pipe that is bonded to a second face of the first vapor chamber, the first heat pipe containing a second working fluid in a second closed space inside the first metal pipe;
    - a second heat pipe including a second metal pipe that is bonded to the second face of the second vapor chamber, the second heat pipe containing a second working fluid in a second closed space inside the second metal pipe;
- a first blower fan;
- a second blower fan;
- a first cooling fin bonded to an end of the first heat pipe and facing a first exhaust port of the first blower fan; and
- a second cooling fin bonded to an end of the second heat pipe and facing a second exhaust port of the second blower fan.

\* \* \* \* \*